United States Patent [19]

Obeng

[11] Patent Number: 5,417,802

[45] Date of Patent: May 23, 1995

[54] INTEGRATED CIRCUIT MANUFACTURING

[75] Inventor: Yaw S. Obeng, Allentown, Pa.

[73] Assignee: AT&T Corp., Murray Hill, N.J.

[21] Appl. No.: 210,193

[22] Filed: Mar. 18, 1994

[51] Int. Cl.⁶ .......................... B44C 1/72; B29C 37/00
[52] U.S. Cl. ........................................ 216/13; 216/83;
    252/79.1; 252/79.4; 134/2
[58] Field of Search .......................... 252/79.1, 79.4;
    156/655, 659.1, 661.1, 668; 549/346; 134/2, 4

[56]  References Cited

U.S. PATENT DOCUMENTS 3,813,309  5/1974  Bakos et al. ............... 252/79.1 X
3,871,929  3/1975  Schevey et al. ............ 156/668

Primary Examiner—William Powell
Attorney, Agent, or Firm—John T. Rehberg

[57]  ABSTRACT

The addition of ligands for chelating Group I and Group II ions to organic solvents used for photoresist removal and etched conductor cleaning enhances the shelf life of these solvents. Furthermore, mobile ion contamination of integrated circuits processed with ligands modified organic solvents is reduced.

8 Claims, No Drawings

INTEGRATED CIRCUIT MANUFACTURING

TECHNICAL FIELD

This invention relates to methods and materials for the manufacture of integrated circuits.

BACKGROUND OF THE INVENTION

Contamination by mobile ions, especially by alkaline and alkaline-earth metal ions, (Group I and Group II elements) is responsible for many failures of integrated circuits, especially during high temperature operating bias burn-in tests. Mobile ion contamination may be introduced at various stages during integrated circuits fabrication.

Those concerned with the development of integrated circuit technology have continuously sought for materials and techniques to reduce mobile ion contamination.

SUMMARY OF THE INVENTION

Mobile ion contamination is reduced by the present invention which illustratively includes an organic solvent together with a ligand for chelating Group I and Group II ions.

In an alternative embodiment, the present invention includes methods of integrated circuit fabrication utilizing organic solvents together with a ligand for chelating Group I and Group II ions.

DETAILED DESCRIPTION

One perennial source of mobile ion contamination is organic solvents used in photoresist removal and post-metal etch cleaning. Typical solvents include blends of primary and secondary amines and other inert solvents such as dimethylsulphoxide and dimethylacetylamide. These solvents are usually stored in plastic (for example, high density polypropylene) containers. The manufacture of these plastic containers involve the use of inorganic catalysts which contain Group I and Group II elements. Consequently, when the solvents are stored in these plastic containers, the Group I and Group II elements leach into the solvent. The concentration of these elements in the solvent increases with duration of contact with the plastic.

Applicant has discovered that organic ligands that coordinate to the Group I and Group II elements such as crown ethers (for example, 18-Crown-6, 18-Crown-5, 18-Crown-4) and cyclodextrines inhibit the adsorption of the Group I and Group II elements on the substrate surfaces. 18-Crown-6 is described in U.S. Pat. Nos. 3,562,295 and 3,997,562.

Addition of the above-mentioned organic ligands to organic solvents conventionally used in either photoresist removal or post-metal etch clean-up has been found to significantly inhibit contamination by Group I and Group II elements. Also, addition of the above-mentioned organic ligands to the above-mentioned organic solvents will significantly extend the shelf life of these solvents with respect to the build-up of Group I and Group II contaminants.

Applicant's experiments using titanium nitride or silicon dioxide films deposited on silicon substrates and inspected with secondary ion mass spectroscopy (SIMS) indicate that the addition of the above-mentioned ligands to such conventional organic solvent formulation such as ACT-CMI, a registered trademark of ACT Incorporated of Allentown, Pa., significantly reduced the short-term (less than 60 minutes at room temperature) contamination of these substrates by the Group I and Group II elements. (However, long-term exposure of these substrates to the ligand-modified organic solvents result in excessive accumulation of Group I and Group II elements on the surface of the substrates as compared to exposure to the unmodified organic solvent.)

Crown ethers can be derivitized with polymethylene groups to convert them into surfactants which would enhance the inhibition properties of the ligand-modified solvents.

Typical application, a patterned photoresist may be removed from etched oxide, metal or semiconductor features formed over oxide (such as silicon dioxide and silicon oxynitride), metal or semiconductor substrate features using the above-mentioned organic solvents modified with the above-mentioned ligands, thereby reducing the possibility of Group I or Group II contamination of the resulting integrated circuit. Alternatively, etched metal conductors over oxide, metal or semiconductor substrates may be rinsed in an organic solvent modified with the above ligands, thereby reducing the possibility of Group I or Group II contamination of the resulting integrated circuit. In addition, the shelf life of the above-mentioned organic solvents may be extended with respect to Group I or Group II contamination by adding the above-mentioned ligands to these solvents in their containers.

I claim:

1. A material comprising:
   an organic solvent capable of photoresist removal together with a ligand for chelating Group I and Group II ions.

2. A material comprising:
   an organic solvent capable of removing polymeric material remaining on metal conductors after said conductors have been etched in the presence of photoresist, together with a ligand for chelating Group I and Group II ions.

3. The material of claim 1 or claim 2 wherein said ligand is chosen from the group consisting of crown ethers and cyclodextrines.

4. A method of integrated circuit fabrication comprising:
   removing patterned photoresist from etched features utilizing an organic solvent together with a ligand for chelating Group I and Group II ions.

5. A method of integrated circuit fabrication comprising:
   rinsing etched metal conductors with an organic solvent together with a ligand for chelating Group I and Group II ions.

6. The method of claim 4 or claim 5 wherein said ligands are chosen from the group consisting of crown ethers and cyclodextrines.

7. The method of claim 4 wherein said etched features are formed over a substrate, and said substrate is chosen from the group consisting of oxides, metals, and semiconductors.

8. The method of claim 5 wherein said metal conductors are formed over a substrate, and said substrate is chosen from the group consisting of oxides, metals, and semiconductors.

* * * * *